(12) United States Patent
Wu et al.

(10) Patent No.: US 9,582,630 B2
(45) Date of Patent: Feb. 28, 2017

(54) SYSTEM AND METHOD FOR CREATING HYBRID RESISTANCE AND CAPACITANCE (RC) NETLIST USING THREE-DIMENSIONAL RC EXTRACTION AND 2.5 DIMENSIONAL RC EXTRACTION

(71) Applicant: Taiwan Semiconductor Manufacturing Company Limited, Hsin-Chu (TW)

(72) Inventors: Ze-Ming Wu, Tainan (TW); Shih Hsin Chen, Hsinchu (TW); Chien-Chih Kuo, Hsinchu (TW); Kai-Ming Liu, Hsinchu (TW); Hsien-Hsin Sean Lee, Duluth, GA (US)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/471,341

(22) Filed: Aug. 28, 2014

(65) Prior Publication Data

US 2016/0063165 A1 Mar. 3, 2016

(51) Int. Cl.
*G06F 9/45* (2006.01)
*G06F 17/50* (2006.01)

(52) U.S. Cl.
CPC .................. *G06F 17/5072* (2013.01)

(58) Field of Classification Search
None
See application file for complete search history.

(56) References Cited

U.S. PATENT DOCUMENTS

| 6,051,027 | A | * | 4/2000 | Kapur | G06F 17/5018 342/196 |
|---|---|---|---|---|---|
| 7,904,844 | B2 | | 3/2011 | Chang et al. | |
| 2009/0030665 | A1 | | 1/2009 | Kerns et al. | |
| 2009/0129191 | A1 | | 5/2009 | Ellis et al. | |
| 2009/0187866 | A1 | * | 7/2009 | Ou | G06F 17/5009 716/136 |
| 2012/0260225 | A1 | | 10/2012 | Su et al. | |
| 2013/0007692 | A1 | * | 1/2013 | Yeh | G06F 17/5036 716/136 |
| 2013/0139121 | A1 | * | 5/2013 | Wu | G06F 17/5036 716/113 |
| 2013/0227501 | A1 | | 8/2013 | Yang et al. | |

(Continued)

*Primary Examiner* — Bryce Aisaka
(74) *Attorney, Agent, or Firm* — Cooper Legal Group, LLC

(57) ABSTRACT

One or more systems and methods for a cell based hybrid resistance and capacitance (RC) extraction are provided. The method includes generating a layout for a semiconductor arrangement, performing a three-dimensional (3D) RC extraction on a target unit cell to obtain a 3D RC result including a coupling capacitance between unit cells, generating a 3D RC netlist based upon the 3D RC result, performing a 2.5 dimensional (2.5D) RC extraction on a peripheral cell to obtain a 2.5D RC netlist, and combining the 3D RC netlist with the 2.5D RC netlist to create a hybrid RC netlist for the layout. In some embodiments, the hybrid RC netlist is generated by stitching the coupling capacitance for at least one of the target unit cell, a repeating unit cell, or the peripheral cell together. In some embodiments, the 3D RC result for the target unit cell is stitched to the repeating unit cell.

20 Claims, 6 Drawing Sheets

(56) References Cited

U.S. PATENT DOCUMENTS

2013/0246990 A1* 9/2013 Yen .................... G06F 17/5036
716/112
2014/0019930 A1 1/2014 Yuh et al.
2014/0282342 A1* 9/2014 Wu ..................... G06F 17/5072
716/122

* cited by examiner

SYSTEM AND METHOD FOR CREATING HYBRID RESISTANCE AND CAPACITANCE (RC) NETLIST USING THREE-DIMENSIONAL RC EXTRACTION AND 2.5 DIMENSIONAL RC EXTRACTION

BACKGROUND

Semiconductor arrangements, such as integrated circuits (ICs), are designed and modeled using schematics and layouts. RC extraction is performed on a layout to create an RC netlist describing connectivity, resistance properties, capacitance properties, or other electrical or size properties of a semiconductor arrangement. The RC netlist is evaluated against a schematic of the semiconductor arrangement to determine whether the layout is an equivalent of the schematic.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
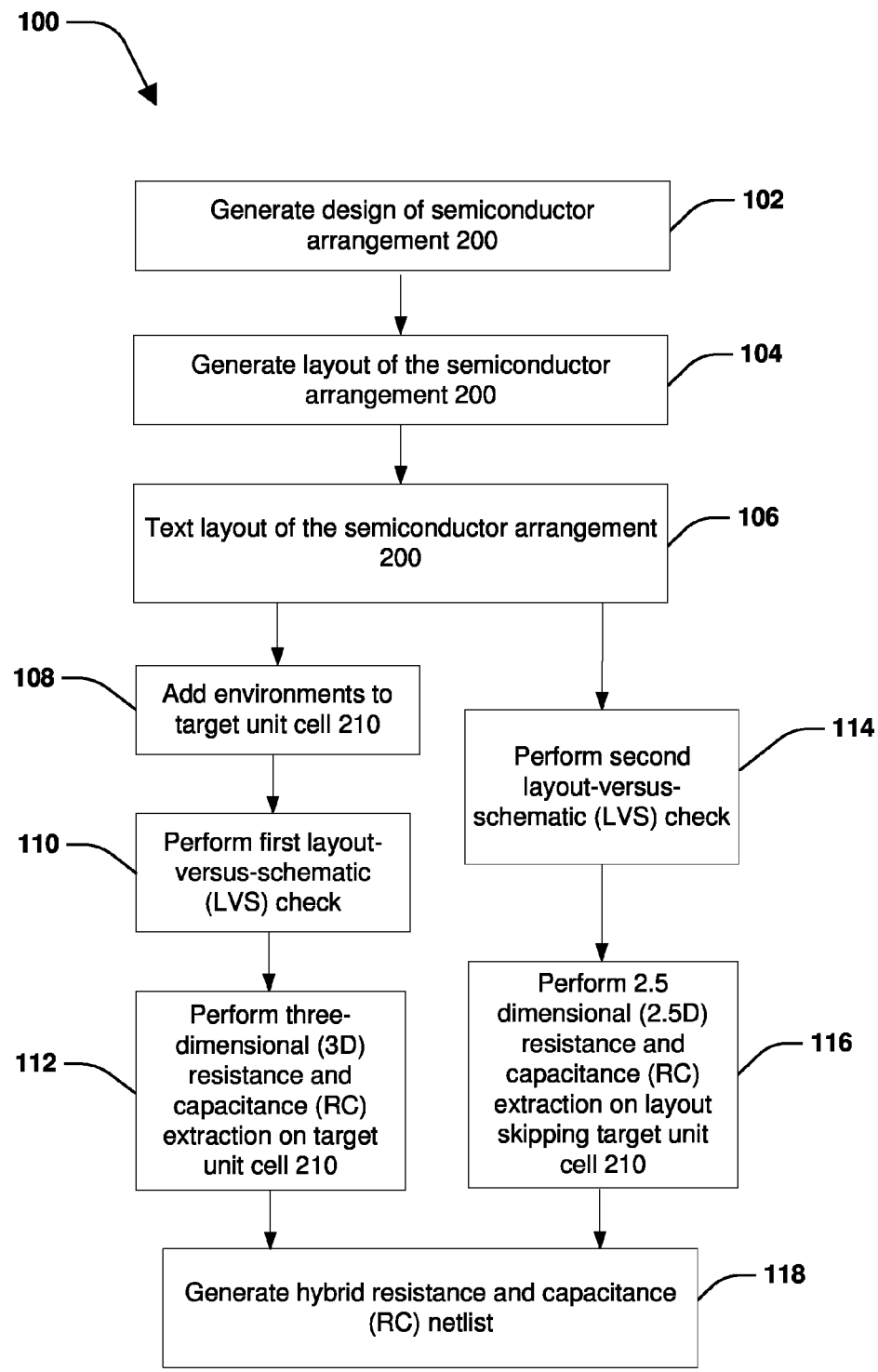
FIG. 1 is a flow diagram illustrating a method for performing a cell based hybrid resistance and capacitance extraction, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of a device in use or operation in addition to the orientation depicted in the figures. The apparatus may be otherwise oriented (rotated 90 degrees or at other orientations) and the spatially relative descriptors used herein may likewise be interpreted accordingly.

One or more systems and one or more methods for performing a cell based hybrid resistance and capacitance (RC) extraction are provided herein. In some embodiments, the cell based hybrid RC extraction comprises determining parasitic parameters of a semiconductor arrangement utilizing a 2.5 dimensional (2.5D) RC extraction tool and a three-dimensional (3D) RC extraction tool. The 3D RC extraction tool evaluates a target unit cell to create a 3D RC netlist. The 2.5D RC extraction tool evaluates one or more peripheral cells to create a 2.5D RC netlist. The 2.5D RC netlist and the 3D RC netlist are combined to form a hybrid RC netlist. In some embodiments, cell based hybrid RC extraction enhances speed and accuracy of extracting parasitic parameters, such as parasitic capacitance or parasitic resistance.

Referring to FIG. 1, illustrated is a flow diagram of a method 100 for generating a hybrid RC netlist according to some embodiments. In some embodiments, the method 100 is used to determine parasitic parameters, such as parasitic capacitance or parasitic resistance, for testing layouts of a design for a semiconductor arrangement before manufacturing. In some embodiments, the hybrid RC netlist is generated by performing a cell based hybrid RC extraction on a layout of a semiconductor arrangement 200, illustrated in FIG. 2.

At 102, a design of the semiconductor arrangement 200 is generated. In some embodiments, the design comprises a Simulation Program with Integrated Circuit Emphasis (SPICE) schematic. In some embodiments, a pre-layout simulation is performed on the design. In some embodiments, the pre-layout simulation comprises a SPICE simulation performed by an electronic design automation (EDA) tool. In some embodiments, the pre-layout simulation determines if the design of the semiconductor arrangement 200 satisfies a predetermined set of parameters for manufacturing the semiconductor arrangement 200.

In some embodiments, the design of the semiconductor arrangement 200 comprises an application specific integrated circuit (ASIC). In some embodiments, the design of the semiconductor arrangement 200 comprises a memory device, such as a static random-access memory (SRAM) device, a dynamic random access memory (DRAM) device, etc. In some embodiments, the design of the semiconductor arrangement 200 comprises a plurality of repeating unit cells. In some embodiments, the repeating unit cells are bit cells, such as a 1-bit cell, a 2-bit cell or a 3-bit cell. In some embodiments, the design of the semiconductor arrangement 200 comprises a plurality of peripheral cells that are positioned along a periphery of the plurality of repeating unit cells.

In some embodiments, the repeating unit cells comprise one or more semiconductor devices. In some embodiments, the repeating unit cells comprise one or more semiconductor devices, such as between about 2 semiconductor devices to about 50 or any other number of semiconductor devices. In some embodiments, the semiconductor devices comprise at least one of a transistor, a diode, a capacitor, an inductor, a fuse, a resistor or an interconnect. In some embodiments, the transistor comprises at least one of a metal oxide semiconductor field effect transistor (MOSFET), a complementary metal oxide semiconductor (CMOS) transistor, a bipolar junction transistor (BJT), a high voltage transistor, a high frequency transistor, a p-channel field effect transistor (PFET), a n-channel field effect transistor (NFET), or a FinFET. In some embodiments, the interconnect comprises at least one of a via, a conductive pad, a conductive trace, or a conductive redistribution layer. In some embodiments, the semiconductor devices comprise other middle or line or back end of line components, such as contacts, insulating layers, dielectric layers, metal levels, bonding sites for chip-to-package connections, etc.

At 104, a layout of the semiconductor arrangement 200 is generated. In some embodiments, the layout is generated based upon the design of the semiconductor arrangement 200. In some embodiments, the layout is a representation of the semiconductor arrangement 200 in terms of planar geometric shapes which correspond to the patterns of at least one of metal, oxide, or semiconductor layers that make up the semiconductor arrangement 200. In some embodiments, the layout is provided in the form of a layout netlist.

Figure 2:
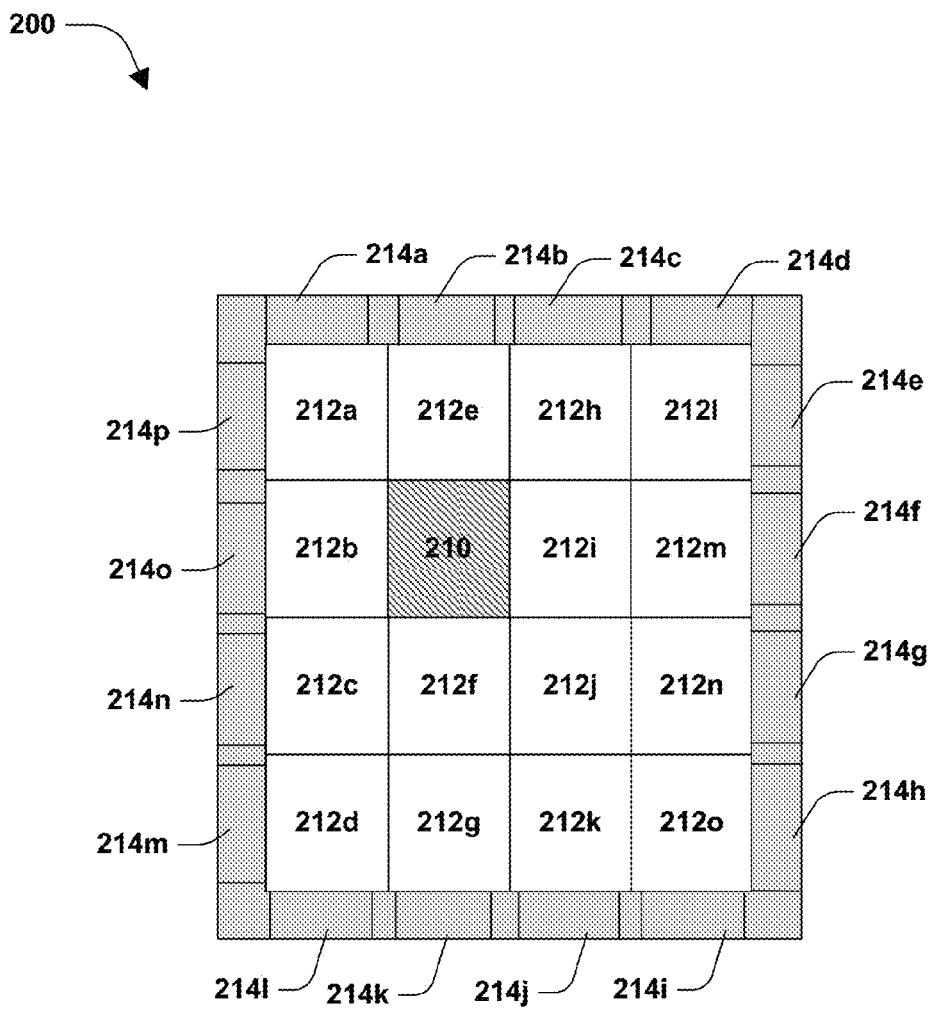
FIG. 2 is a layout of a semiconductor arrangement, according to some embodiments.

In some embodiments, as illustrated in FIG. 2, the layout of the semiconductor arrangement 200 comprises at least one of a target unit cell 210, repeating unit cells 212a-212o, or peripheral cells 214a-214p. In some embodiments, the target unit cell 210 and the repeating unit cells 212a-212o are identified from an array of like unit cells within the layout. In some embodiments, the array of unit cells is at least one of a 2×2 array, a 4×4 array, a 8×8 array, a 16×16 array, a 32×32 array, 64×64 array, or the like. In some embodiments, the target unit cell 210 comprises at least one of a middle end of line component or a back end of line component.

At 106, the layout of the semiconductor arrangement 200 is texted. In some embodiments, the text is added to the layout netlist. In some embodiments, the text, added to the layout netlist, identifies a component within at least one of the repeating unit cells 212a-212o, the target unit cell 210, or the peripheral cells 214a-214p. In some embodiments, the text corresponds to at least one of a contact, a via, a pwell, a nwell, a net(wire), a power supply, a ground, a word line, a bit line, or another form of a metal connect. In some embodiments, one or more nets running in or out of the target unit cell 210 are texted. In some embodiments, when a net is connected on the outside of the target unit cell 210, a virtual connection text is used to identify at least one of the net or a net connection. In some embodiments, a first text is added to a first component in the target unit cell 210 and a second text is added to a second component in at least one of the repeating unit cells 212a-212o.

At 108, an environment is added to at least one of the target unit cell 210 or the repeating unit cells 212a-212o. In some embodiments, the environment defines at least one environmental influence on the target unit cell 210, such as a bias. In some embodiments, the environment characterizes the bias that is applied by at least one of the repeating unit cells 212a-212o to the target unit cell 210. In some embodiments, the environment defines the bias from edge polygons of at least one of the repeating unit cells 212a-212o adjacent to the target unit cell 210. In some embodiments, the bias comprises a coupling capacitance between the target unit cell 210 and at least one of the repeating unit cells 212a-212o. In some embodiments, the environment comprises a third text added to at least one component proximate a boundary of the target unit cell 210 and a fourth text added to the same or different component in at least one of the repeating unit cells 212a-212o proximate the boundary of the target unit cell 210. In some embodiments, the environment is used to determine a capacitive coupling at the boundary between the target unit cell 210 and at least one of the repeating unit cells 212a-212o. In some embodiments, the environment improves signal integrity by accounting for coupling between the target unit cell 210 and at least one of the repeating unit cells 212a-212o.

At 110, a first layout-versus-schematic (LVS) check is performed on at least one of the repeating unit cells 212a-212o or the target unit cell 210. In some embodiments, the first LVS check is performed to check whether the layout for at least one of the repeating unit cells 212a-212o or the target unit cell 210 corresponds to the design. In some embodiments, an EDA tool performs the first LVS check. In some embodiments, the EDA tool generates a first LVS netlist. In some embodiments, the first LVS netlist is generated based upon at least one of the components or connections within at least one of the repeating unit cells 212a-212o or the target unit cell 210. In some embodiments, the first LVS netlist is compared with the design netlist to determine whether the first LVS netlist and the design netlist match within a matching tolerance.

In some embodiments, a design rule check (DRC) is performed before or after the first LVS check. In some embodiments, the DRC checks whether the layout satisfies manufacturing design rules. In some embodiments, if a design rule is violated, a correction is made to at least one of the layout or the design. In some embodiments, other verification processes are used.

At 112, a 3D RC extraction is performed on the target unit cell 210. In some embodiments, a 3D RC extraction tool performs the 3D RC extraction. In some embodiments, the 3D RC extraction tool comprises a 3D field solver. In some embodiments, the 3D RC extraction tool provides a relatively accurate RC extraction for the target unit cell 210, such as an extraction of complex 3D structures located at advanced process nodes. In some embodiments, a 3D window region for the 3D RC extraction is generated to identify a boundary of the target unit cell 210. In some embodiments, the 3D RC extraction is performed on one or more semiconductor devices within or touching the boundary of the target unit cell 210.

In some embodiments, the 3D RC extraction is performed on the target unit cell 210 to obtain a 3D RC result. In some embodiments, the 3D RC result comprises at least one of a coupling capacitance or a parasitic parameter. In some embodiments, the 3D RC result comprises a coupling capacitance between a first component in the target unit cell 210 and a second component in at least one of the repeating unit cells 212a-212o. In some embodiments, the 3D RC result comprises at least one of a parasitic resistance or a parasitic capacitance of a component, such as a semiconductor device, within the target unit cell 210. In some embodiments, the 3D RC extraction tool through solving Maxwell's equations calculates at least one of the parasitic resistance or the parasitic capacitance. In some embodiments, at least one of the parasitic resistance or the parasitic capacitance is used to determine timing simulations in subsequent operations. In some embodiments, a 3D RC netlist is generated based upon the 3D RC result.

At 114, a second LVS check is performed. In some embodiments, the second LVS check is performed on the layout of the semiconductor arrangement 200. In some embodiments, the second LVS check is performed to check whether the layout for the semiconductor arrangement 200 corresponds to the design. In some embodiments, an EDA tool performs the second LVS check. In some embodiments, the EDA tool used for the second LVS check is the same as the EDA tool used for the first LVS check. In some embodiments, the EDA tool that performs the LVS check generates a second LVS netlist. In some embodiments, the second LVS netlist is generated in response to at least one of the recognized components or connections within at least one of the peripheral cells 214a-214p. In some embodiments, the second LVS netlist is compared with the design netlist to determine whether the second LVS netlist and the design netlist match within a matching tolerance.

At 116, a 2.5D RC extraction is performed. In some embodiments, a 2.5D RC extraction tool performs the 2.5D RC extraction. In some embodiments, the 2.5D RC extraction is performed on the layout of the semiconductor device 200. In some embodiments, the 2.5D RC extraction is performed to determine at least one of a parasitic resistance or a parasitic capacitance of components inside at least one of the peripheral cells 214a-214p. In some embodiments, at least one of the extracted parasitic capacitance or the parasitic resistance is added to the second LVS netlist to output a 2.5D RC netlist. In some embodiments, the 2.5D RC extraction extracts pin information for at least one of the repeating unit cells 212a-212o, the peripheral cells 214a-214p, or the target unit cell 210. In some embodiments, the 2.5D RC netlist comprises the extracted pin information. In some embodiments, the pin information is used to preserve hierarchical connections between at least one of components or couplings within the semiconductor arrangement 200. In some embodiments, the 2.5D RC extraction tool skips the 2.5D RC extraction of at least one of the repeating unit cells 212a-212o or the target unit cell 210. In some embodiments, the 2.5D RC extraction of the target unit cell 210 and the repeating unit cells 212a-212o is skipped based upon the target unit cell 210 and the repeating unit cells 212a-212o being treated as a macro. In some embodiments, the 2.5D RC extraction of the parasitic parameters in at least one of the repeating unit cells 212a-212o or the target unit cell 210 is skipped but the pin information for at least one of the target unit cell 210 or the repeating unit cells 212a-212o is extracted. In some embodiments, the 2.5D RC extraction is faster and less demanding in terms of computing resources needed for processing than the 3D RC extraction. In some embodiments, the 3D RC extraction has increased accuracy relative to the 2.5D RC extraction.

At 118, a hybrid RC netlist is generated. In some embodiments, the 2.5D RC netlist and the 3D RC netlist are combined to create the hybrid RC netlist. In some embodiments, the 3D RC result for the target unit cell 210 is stitched into at least one of the repeating unit cells 212a-212o to create a stitched hybrid RC result for at least one of the repeating unit cells 212a-212o. In some embodiments, the stitched hybrid RC result is added to the hybrid RC netlist. In some embodiments, the 3D RC result for the target unit cell 210 is stitched into at least one of the repeating unit cells 212a-212o based on the pin information from the 2.5D RC netlist. In some embodiments, stitching the 3D RC result to the repeating unit cells 212a-212o is faster than performing a 3D RC extraction on each of the repeating unit cells 212a-212o individually.

In some embodiments, the 2.5D RC netlist and the 3D RC netlist are stitched together to bridge a coupling capacitance between at least one of the repeating unit cells 212a-212o, the peripheral cells 214a-214p, or the target unit cell 210. In some embodiments, the coupling capacitance between a first component in the target unit cell 210 and a second component in at least one of the repeating unit cells 212a-212o is stitched together. In some embodiments, pin information is used to combine the extracted parasitic parameters from the 2.5D RC extraction and the 3D RC extraction into the hybrid RC netlist. In some embodiments, the text added to at least one of the repeating unit cells 212a-212o, the peripheral cells 214a-214p, or the target unit cell 210 is used to combine the 2.5D RC netlist and the 3D RC netlist. In some embodiments, generating a hybrid RC netlist is faster than performing a 3D RC extraction on the entire layout and more accurate than performing a 2.5D RC extraction on the entire layout.

Figure 3:
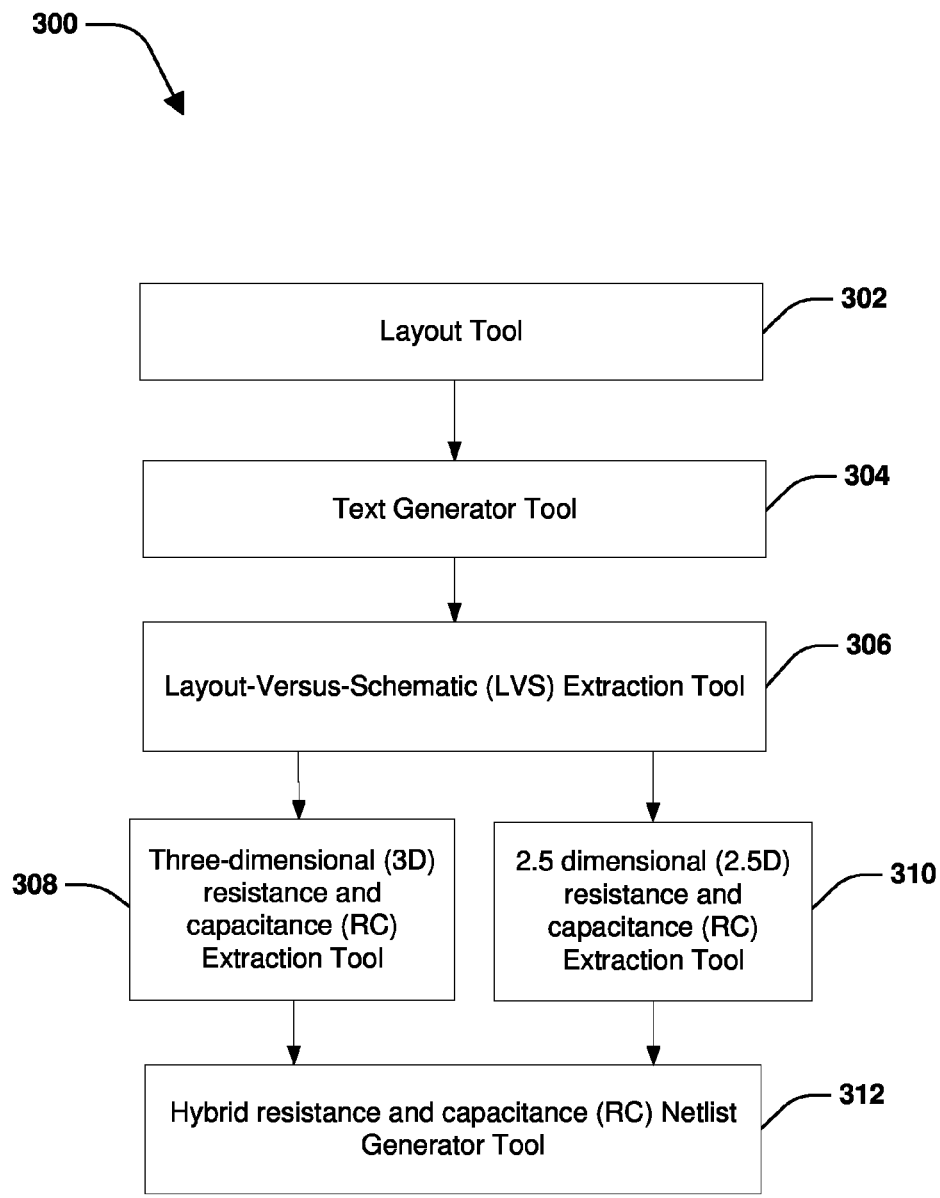
FIG. 3 is a flow diagram illustrating a method for performing a cell based hybrid resistance and capacitance extraction, in accordance with some embodiments.

FIG. 3 illustrates a system 300 for generating a hybrid RC netlist. The system 300 comprise at least one of a layout tool 302, a text generator tool 304, a LVS extraction tool 306, a 3D RC extraction tool 308, a 2.5D RC extraction tool 310, or a hybrid RC netlist generator tool 312. In some embodiments, a design of a semiconductor arrangement 200 is inputted into the layout tool 302. The layout tool 302 is configured to generate a layout based upon the design of the semiconductor arrangement 200. In some embodiments, the layout is texted by the text generator tool 304. In some embodiments, the text generator tool 304 is configured to add virtual connection text to at least one of the repeating unit cells 212a-212o or the target unit cell 210. In some embodiments, the LVS extraction tool 306 checks the layout. In some embodiments, the LVS extraction tool 306 is configured to perform an LVS check on the layout to determine if the layout generated by the layout tool 302 corresponds to the design of the semiconductor arrangement 200. In some embodiments, the 3D RC extraction tool 308 is configured to identify a target unit cell 210 within the layout. In some embodiments, the 3D RC extraction tool 308 is configured to perform a 3D RC extraction on the target unit cell 210. In some embodiments, the 3D RC extraction tool 308 generates a 3D RC netlist in response to the 3D RC extraction performed on the target unit cell 210. In some embodiments, the 3D RC extraction tool 308 generates a 3D RC result for the target unit cell 210. In some embodiments, the 3D result comprises a coupling capacitance between the target unit cell 210 and at least one of repeating unit cells 212a-212o. In some embodiments, the 3D RC result is inputted to the hybrid RC netlist generator tool 312 to create a stitched RC result for at least one of the repeating unit cells 212a-212o. In some embodiments, the 2.5D extraction tool 310 is configured to perform a 2.5D extraction on at least one of the peripheral cells 214a-214p. In some embodiments, the 2.5D RC extraction tool 310 is configured to skip at least one of the target unit cell 210 or the repeating unit cells 212a-212o. In some embodiments, the 2.5D RC extraction tool 310 is configured to extract pin information for the layout of the semiconductor arrangement 200. In some embodiments, the 2.5D extraction tool 310 is configured to generate a 2.5D RC netlist in response to the 2.5D RC extraction. In some embodiments, the hybrid RC netlist generator tool 312 is configured to combine the 3D RC netlist with the 2.5D RC netlist to generate a hybrid RC netlist. In some embodiments, the hybrid RC netlist generator tool 312 is configured to stitch the 3D RC netlist to the 2.5D RC netlist. In some embodiments, the stitched 3D RC result is inputted into the hybrid RC netlist. In some embodiments, the 3D RC netlist is stitched to the 2.5D RC netlist to bridge a coupling capacitance between one or more cells in the layout. In some embodiments, the coupling capacitance between one or more cells in the layout is stitched together based on the pin information.

Figure 4:
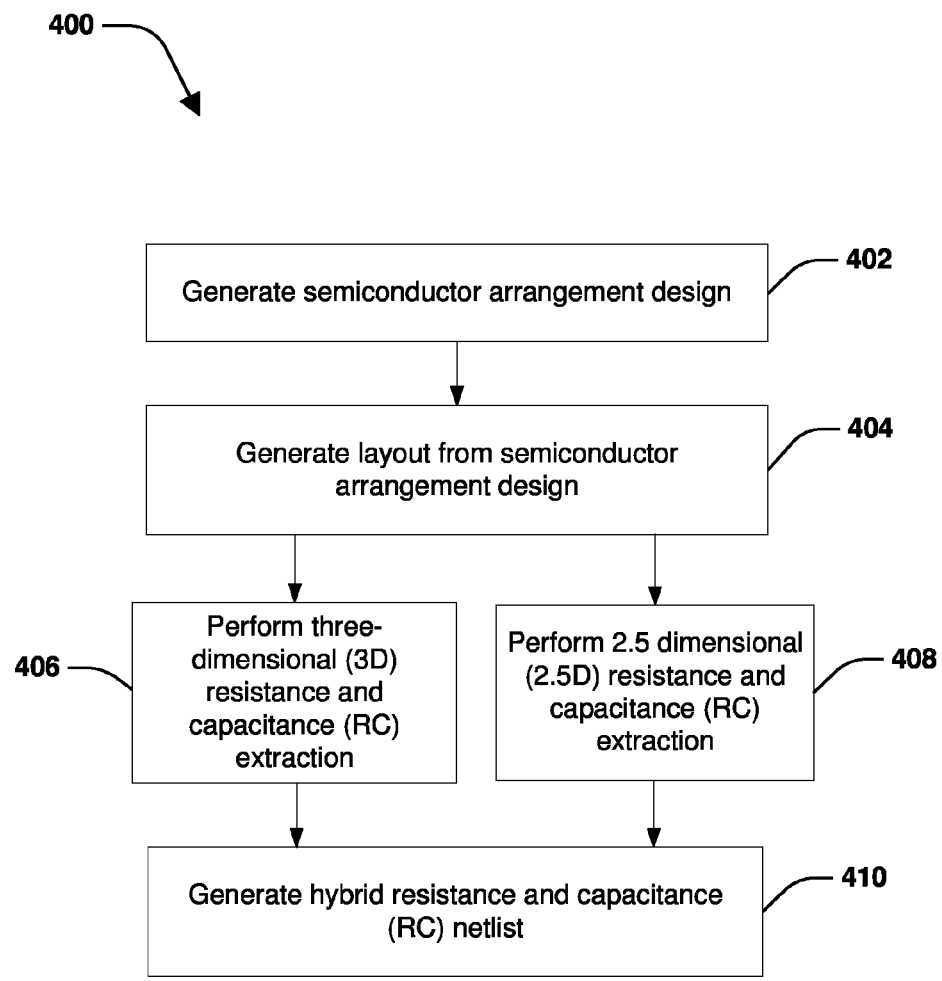
FIG. 4 is an illustration of a system for performing a cell based hybrid resistance and capacitance extraction, in accordance with some embodiments.

FIG. 4 illustrates a flow diagram of a method 400 for performing a cell based hybrid RC extraction on a semiconductor arrangement 200 according to some embodiments. At 402, a design of a semiconductor arrangement 200 is generated. In some embodiments, the design is of a memory device, such as an SRAM device. At 404, a layout is generated from the design of the semiconductor arrangement 200. In some embodiments, at least one of text or an environment is added to at least one of a target unit cell 210 or a repeating unit cell 212a-212o within the layout. In some embodiments, the environment defines at least one component in at least one of the repeating unit cells 212a-212o proximate the target unit cell 210. In some embodiments, a LVS check is performed on the layout. At 406, a 3D RC extraction is performed on the target unit cell 210. In some embodiments, a 3D RC extraction tool performs the 3D RC extraction. In some embodiments, the 3D RC extraction is performed on the target unit cell 210 to obtain a 3D RC result. In some embodiments, the 3D RC result comprises at least one of a parasitic parameter or a coupling capacitance. In some embodiments, a 3D RC netlist is generated based upon at least the 3D RC result. At 408, a 2.5D RC extraction is performed. In some embodiments, the 2.5D RC extraction is performed on the layout, and skips at least one of the target unit cell 210 or the repeating unit cells 212a-212o. In some embodiments, the 2.5D RC extraction is performed on at least one of peripheral cells 214a-214o. In some embodiments, the 2.5D RC extraction is performed by a 2.5D RC extraction tool. In some embodiments, the 2.5D RC extraction tool generates a 2.5D RC netlist based upon at least one of the peripheral cells 214a-214p. In some embodiments, the 2.5D RC extraction extracts pin information for at least one of the target unit cell 210 or the repeating unit cells 212a-212o. At 410, a hybrid RC netlist is generated. In some embodiments, the hybrid RC netlist is generated by combining the 3D RC netlist with the 2.5D RC netlist. In some embodiments, the 3D RC netlist is stitched to the 2.5D RC netlist to bridge a coupling capacitance between one or more cells in the layout. In some embodiments, the coupling capacitance between one or more cells in the layout is stitched together based on the pin information.

Figure 5:
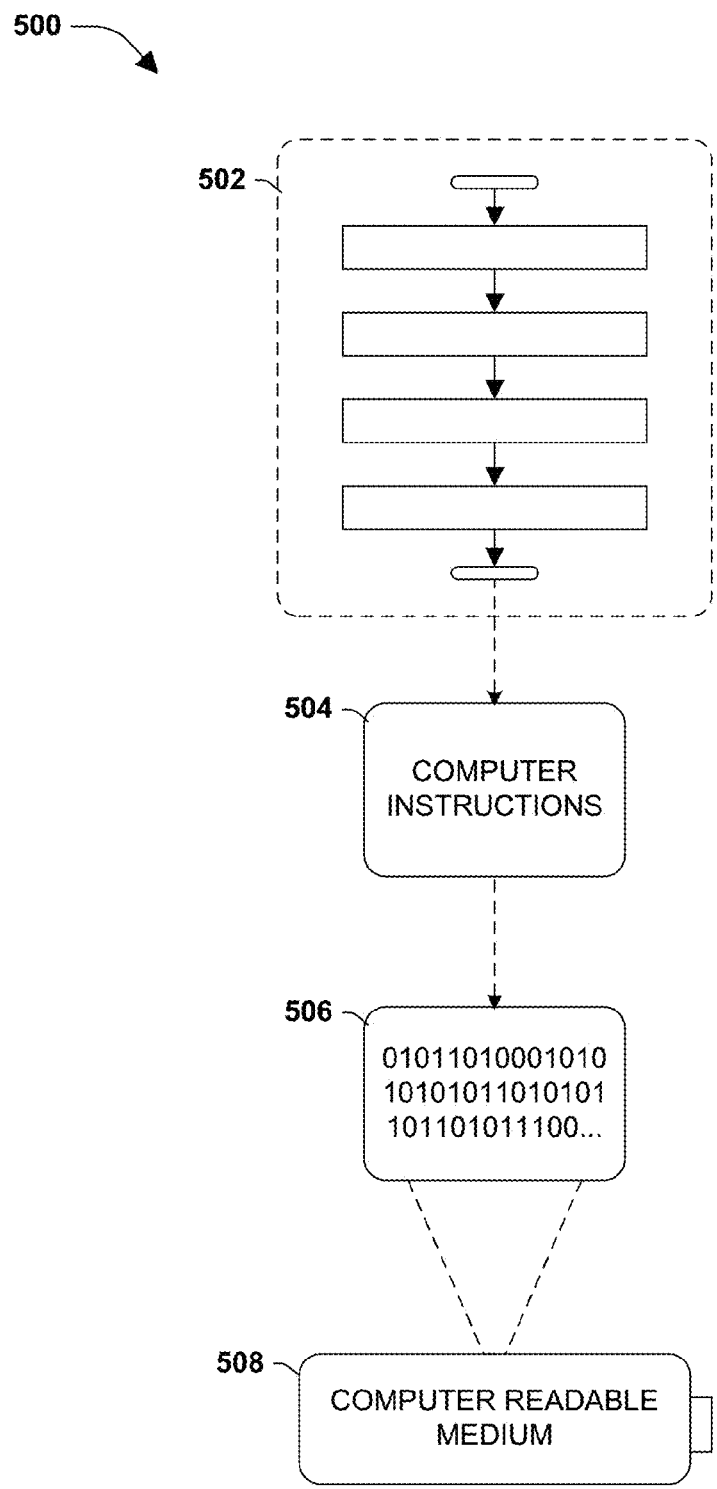
FIG. 5 is an illustration of an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 5, wherein the implementation 500 comprises a computer-readable medium 508 (e.g., a CD-R, DVD-R, flash drive, a platter of a hard disk drive, etc.), on which is encoded computer-readable data 506. This computer-readable data 506 in turn comprises a set of computer instructions 504 configured to operate according to one or more of the principles set forth herein. In one such embodiment 500, the processor-executable computer instructions 504 may be configured to perform a method 502, such as at least some of the exemplary method 100 of FIG. 1 and/or at least some of the exemplary method 400 of FIG. 4, for example. In another such embodiment, the processor-executable instructions 512 may be configured to implement a system, such as at least some of the exemplary system 300 of FIG. 3, for example. Many such computer-readable media may be devised by those of ordinary skill in the art that are configured to operate in accordance with the techniques presented herein.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 6:
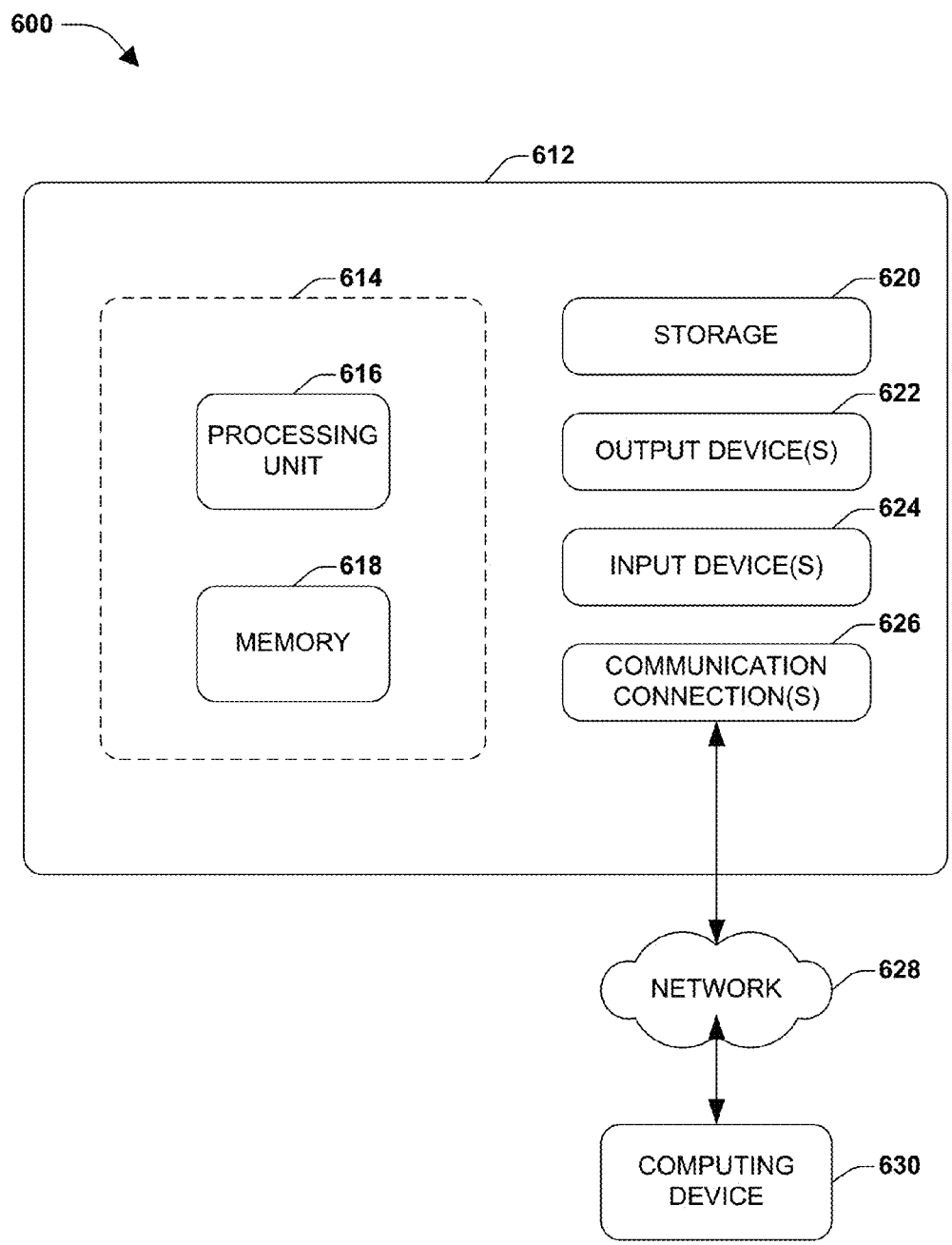
FIG. 6 illustrates an example computing environment wherein one or more of the provisions set forth herein may be implemented, in accordance with some embodiments.

FIG. 6 and the following discussion provide a brief, general description of a suitable computing environment to implement embodiments of one or more of the provisions set forth herein. The operating environment of FIG. 6 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 6 illustrates an example of a system 600 comprising a computing device 612 configured to implement one or more embodiments provided herein. In one configuration, computing device 612 includes at least one processing unit 616 and memory 618. Depending on the exact configuration and type of computing device, memory 618 may be volatile (such as RAM, for example), non-volatile (such as ROM, flash memory, etc., for example) or some combination of the two. This configuration is illustrated in FIG. 6 by dashed line 614.

In other embodiments, device 612 may include additional features and/or functionality. For example, device 612 may also include additional storage (e.g., removable and/or non-removable) including, but not limited to, magnetic storage, optical storage, and the like. Such additional storage is illustrated in FIG. 6 by storage 620. In some embodiments, computer readable instructions to implement one or more embodiments provided herein may be in storage 620. Storage 620 may also store other computer readable instructions to implement an operating system, an application program, and the like. Computer readable instructions may be loaded in memory 618 for execution by processing unit 616, for example.

The term "computer readable media" as used herein includes computer storage media. Computer storage media includes volatile and nonvolatile, removable and non-removable media implemented in any method or technology for storage of information such as computer readable instructions or other data. Memory 618 and storage 620 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 612. Any such computer storage media may be part of device 612.

Device 612 may also include communication connection(s) 626 that allows device 612 to communicate with other devices. Communication connection(s) 626 may include, but is not limited to, a modem, a Network Interface Card (NIC), an integrated network interface, a radio frequency transmitter/receiver, an infrared port, a USB connection, or other interfaces for connecting computing device 612 to other computing devices. Communication connection(s) 626 may include a wired connection or a wireless connection. Communication connection(s) 626 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 612 may include input device(s) 624 such as keyboard, mouse, pen, voice input device, touch input device, infrared cameras, video input devices, and/or any other input device. Output device(s) 622 such as one or more displays, speakers, printers, and/or any other output device may also be included in device 612. Input device(s) 624 and output device(s) 622 may be connected to device 612 via a wired connection, wireless connection, or any combination thereof. In some embodiments, an input device or an output device from another computing device may be used as input device(s) 624 or output device(s) 622 for computing device 612.

Components of computing device 612 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 612 may be interconnected by a network. For example, memory 618 may be comprised of multiple physical memory units located in different physical locations interconnected by a network.

Those skilled in the art will realize that storage devices utilized to store computer readable instructions may be distributed across a network. For example, a computing device 630 accessible via a network 628 may store computer readable instructions to implement one or more embodiments provided herein. Computing device 612 may access computing device 630 and download a part or all of the computer readable instructions for execution. Alternatively, computing device 612 may download pieces of the computer readable instructions, as needed, or some instructions may be executed at computing device 612 and some at computing device 630.

According to some aspects of the instant disclosure, a method for creating a hybrid resistance and capacitance (RC) netlist is provided. The method comprises generating a layout for a semiconductor arrangement, performing a 3D RC extraction on a target unit cell to obtain a 3D RC netlist having a 3D RC result, performing a 2.5D RC extraction on a peripheral cell to obtain a 2.5D RC netlist, and combining the 3D RC netlist with the 2.5D RC netlist to create a hybrid RC netlist for the layout. The layout comprises the target unit cell, a repeating unit cell and the peripheral cell.

According to some aspects of the instant disclosure, a system for creating a hybrid resistance and capacitance (RC) netlist is provided. The system comprises a 3D RC extraction tool, a 2.5D RC extraction tool and a hybrid RC netlist generator tool. The 3D RC extraction tool is configured to perform a 3D RC extraction on a target unit cell of a layout for a semiconductor arrangement to generate a 3D RC netlist having a 3D RC result. The 3D RC result comprises a parasitic parameter of the target unit cell, and a coupling capacitance from between the target unit cell and a repeating unit cell. The 2.5D RC extraction tool is configured to perform a 2.5D RC extraction on a peripheral cell of the layout to generate a 2.5D RC netlist. The hybrid RC netlist generator tool is configured to combine the 3D RC netlist with the 2.5D RC netlist to generate a hybrid RC netlist and to stitch the 3D RC result for the target unit cell to the repeating unit cell to create a stitched result for inclusion within the hybrid RC netlist.

According to some aspects of the instant disclosure, a computer readable medium comprising instructions that when executed perform a method for creating a hybrid resistance and capacitance (RC) netlist is provided. The method comprises receiving a layout for a semiconductor arrangement, identifying a target unit cell within the layout, performing a 3D RC extraction on the target unit cell to generate a 3D RC netlist having a 3D RC result, performing a 2.5D RC extraction on a peripheral cell to generate a 2.5D RC netlist, combining the 3D RC netlist with the 2.5D RC netlist to create a hybrid RC netlist, and stitching the 3D RC result to a repeating unit cell to create a stitched result for inclusion within the hybrid RC netlist.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

It will be appreciated that layers, features, elements, etc. depicted herein are illustrated with particular dimensions relative to one another, such as structural dimensions or orientations, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for creating a hybrid resistance and capacitance (RC) netlist, comprising:
    generating a layout for a semiconductor arrangement, the layout comprising:
        a target unit cell;
        a repeating unit cell; and
        a peripheral cell;
    performing a three-dimensional (3D) RC extraction on the target unit cell to obtain a 3D RC netlist having a 3D RC result;
    performing a 2.5 dimensional (2.5D) RC extraction on the peripheral cell to obtain a 2.5D RC netlist; and
    combining the 3D RC netlist with the 2.5D RC netlist to create a hybrid RC netlist for the layout, wherein the method is implemented via a processing unit.

2. The method of claim 1, the performing a 3D extraction comprising:
    obtaining a coupling capacitance between the target unit cell and the repeating unit cell.

3. The method of claim 1, the performing a 2.5D RC extraction comprising:
    extracting pin information for at least one of the target unit cell or the repeating unit cell.

4. The method of claim 1, the combining comprising:
    stitching the 3D RC result to the repeating unit cell.

5. The method of claim 1, the generating a layout comprising:
    adding text to at least one of the target unit cell, the repeating unit cell or the peripheral cell.

6. The method of claim 1, the generating a layout comprising:
    adding a virtual connection text to at least one of the target unit cell, the repeating unit cell or the peripheral cell.

7. The method of claim 1, the combining comprising:
    stitching the 3D RC netlist and the 2.5D RC netlist to bridge a coupling capacitance between one or more cells of the layout.

8. The method of claim 1, the performing a 2.5D RC extraction comprising:
    configuring the 2.5D RC extraction to skip the 2.5 D RC extraction of the target unit cell and repeating unit cell.

9. The method of claim 1, further comprising:
    adding an environment to at least one of the target unit cell or the repeating unit cell, the environment defining at least one environmental influence for the semiconductor arrangement.

10. The method of claim 1, further comprising:
    performing a layout-versus-schematic (LVS) check on at least one of the repeating unit cell, the peripheral cell or the target unit cell.

11. The method of claim 1, the generating a layout comprising:
    identifying the target unit cell and the repeating unit cell within an array of unit cells.

12. The method of claim 1, the performing a 3D RC extraction comprising:
    defining a 3D window region for the 3D RC extraction to comprise a boundary of the target unit cell.

13. A non-transitory computer readable medium comprising instructions that when executed perform a method for creating a hybrid resistance and capacitance (RC) netlist, the method comprising:
    receiving a layout for a semiconductor arrangement;
    identifying a target unit cell within the layout;
    performing a three-dimensional (3D) RC extraction on the target unit cell to generate a 3D RC netlist having a 3D RC result;
    performing a 2.5 dimensional (2.5D) RC extraction on a peripheral cell to generate a 2.5D RC netlist;
    combining the 3D RC netlist with the 2.5D RC netlist to create a hybrid RC netlist; and
    stitching the 3D RC result to a repeating unit cell to create a stitched result for inclusion within the hybrid RC netlist.

14. The non-transitory computer readable medium of claim 13, the method further comprising:
    adding an environment to at least one of the target unit cell or the repeating unit cell, the environment defining at least one environmental influence on the target unit cell.

15. The non-transitory computer readable medium of claim 13, the performing a 3D RC extraction comprising:
    obtaining a coupling capacitance between the target unit cell and the repeating unit cell.

16. The non-transitory computer readable medium of claim 13, the method further comprising:

performing a layout-versus-schematic (LVS) check on at least one of the peripheral cell or the target unit cell.

17. A system for creating a hybrid resistance and capacitance (RC) netlist, comprising:
- a processing unit; and
- memory comprising instructions that when executed by the processing unit implement:
  - a three-dimensional (3D) RC extraction tool configured to:
    - perform a 3D RC extraction on a target unit cell of a layout for a semiconductor arrangement to generate a 3D RC netlist having a 3D RC result, the 3D RC result comprising:
      - a parasitic parameter of the target unit cell; and
      - a coupling capacitance from between the target unit cell and a repeating unit cell;
  - a 2.5 dimensional (2.5D) RC extraction tool configured to:
    - perform a 2.5D RC extraction on a peripheral cell of the layout to generate a 2.5D RC netlist; and
  - a hybrid RC netlist generator tool configured to:
    - combine the 3D RC netlist with the 2.5D RC netlist to generate a hybrid RC netlist; and
    - stitch the 3D RC result for the target unit cell to the repeating unit cell to create a stitched result for inclusion within the hybrid RC netlist.

18. The system of claim 17, the memory comprising instructions that when executed by the processing unit implement:
- a text generator tool configured to:
  - add text to at least one of the target unit cell, the repeating unit cell or the peripheral cell.

19. The system of claim 17, the target unit cell labeled with first text and the repeating unit cell labeled with second text, and the hybrid RC netlist generator tool further configured to:
- bridge the first text on the target unit cell with the second text on the repeating unit cell.

20. The system of claim 17, the hybrid RC netlist generator tool further configured to:
- stitch the 3D RC netlist and the 2.5D RC netlist to bridge a coupling capacitance between one or more cells of the layout.

* * * * *